United States Patent
Chang et al.

(10) Patent No.: US 10,811,412 B2
(45) Date of Patent: Oct. 20, 2020

(54) METHOD OF FABRICATING SEMICONDUCTOR DEVICE

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/524,142

(22) Filed: Jul. 28, 2019

(65) Prior Publication Data
US 2019/0386003 A1 Dec. 19, 2019

Related U.S. Application Data

(63) Continuation of application No. 15/627,329, filed on Jun. 19, 2017, now Pat. No. 10,366,990, which is a (Continued)

(51) Int. Cl.
*H01L 27/088* (2006.01)
*H01L 29/66* (2006.01)
(Continued)

(52) U.S. Cl.
CPC ...... *H01L 27/0886* (2013.01); *H01L 29/0657* (2013.01); *H01L 29/0847* (2013.01); *H01L 29/4966* (2013.01); *H01L 29/66795* (2013.01); *H01L 29/785* (2013.01); *H01L 29/7848* (2013.01); *H01L 29/7853* (2013.01)

(58) Field of Classification Search
CPC ............. H01L 27/0886; H01L 29/0657; H01L 29/0847; H01L 29/4966; H01L 29/66795; H01L 29/7848; H01L 29/785; H01L 29/7853
See application file for complete search history.

(56) References Cited

U.S. PATENT DOCUMENTS

| 9,508,556 | B1 * | 11/2016 | Tsai | H01L 21/823821 |
| 9,570,567 | B1 * | 2/2017 | Chang | H01L 29/785 |
| 2016/0315172 | A1 * | 10/2016 | Wu | H01L 29/785 |

FOREIGN PATENT DOCUMENTS

| TW | 200917484 | 4/2009 |
| TW | 201126614 | 8/2011 |

OTHER PUBLICATIONS

"Office Action of Taiwan Counterpart Application", dated Jun. 8, 2020, p. 1-4.

* cited by examiner

*Primary Examiner* — Joseph M Galvin, III
(74) *Attorney, Agent, or Firm* — JCIPRNET

(57) ABSTRACT

A FinFET including a gate stack, a semiconductor fin embedded in the gate stack, a source and a drain disposed is provided. The semiconductor fin extends along a widthwise direction of the gate stack and has a first concave and a second concave exposed at sidewalls of the gate stack respectively. The source and drain are disposed at two opposite sides of the gate stack. The source includes a first portion in contact with and embedded in the first concave. The drain includes a second portion in contact with and embedded in the second concave. The first portion and the second portion are covered by the gate stack.

20 Claims, 13 Drawing Sheets

Related U.S. Application Data continuation of application No. 15/062,215, filed on Mar. 7, 2016, now Pat. No. 9,685,554.

(51) Int. Cl.
*H01L 29/78* (2006.01)
*H01L 29/06* (2006.01)
*H01L 29/08* (2006.01)
*H01L 29/49* (2006.01)

METHOD OF FABRICATING SEMICONDUCTOR DEVICE

CROSS-REFERENCE TO RELATED APPLICATION

This is a continuation application of and claims the priority benefit of U.S. application Ser. No. 15/627,329, filed on Jun. 19, 2017, now allowed, which is a continuation application of and claims the priority benefit of U.S. application Ser. No. 15/062,215, filed on Mar. 7, 2016, now U.S. Pat. No. 9,685,554, issued on Jun. 20, 2017. The entirety of the above-mentioned patent application is hereby incorporated by reference herein and made a part of this specification.

BACKGROUND

As the semiconductor devices keeps scaling down in size, three-dimensional multi-gate structures, such as the fin-type field effect transistors (FinFETs), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

Currently, epitaxial source and drain for FinFETs are formed after fin recess process. The epitaxial strained source and drain are required to be embedded in gate stack to enhance device boost of FinFETs. During formation of recesses formed for growth of epitaxial source and drain, the lateral dimension and the depth of the recesses increase simultaneously. However, sub-fin leakage path may occur when the depth of the recesses increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
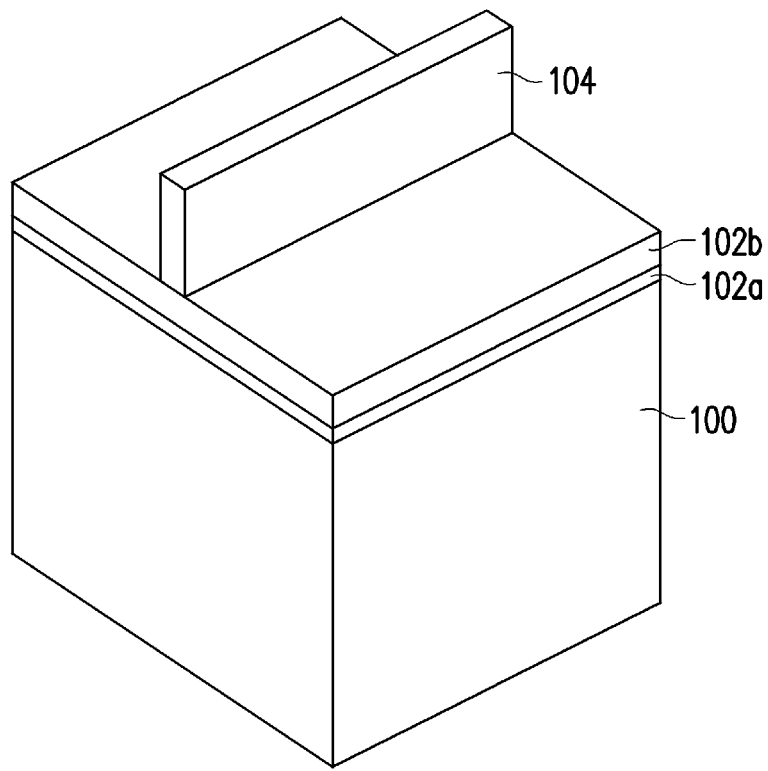
FIGS. 1A-1H are perspective views of a method for fabricating a p-type FinFETs of a semiconductor device in accordance with some embodiments.
Figure 1B:
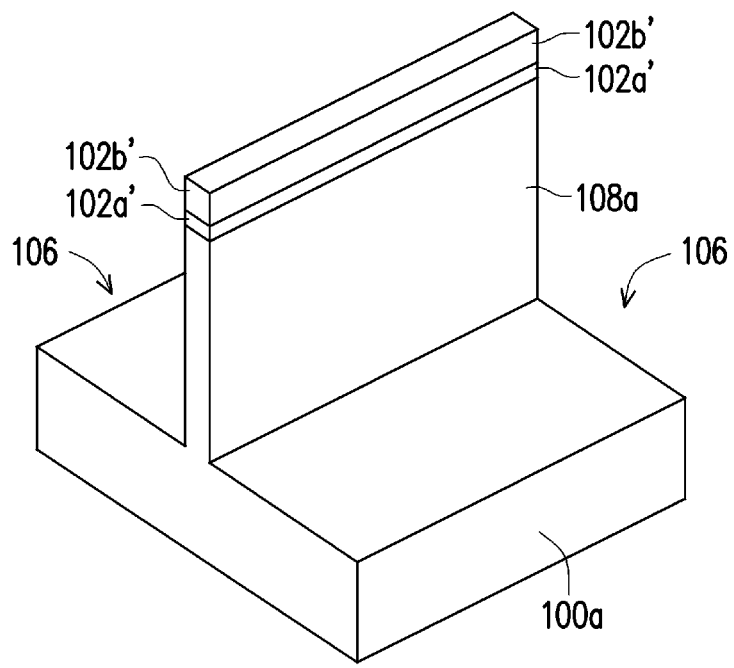
Figure 1C:
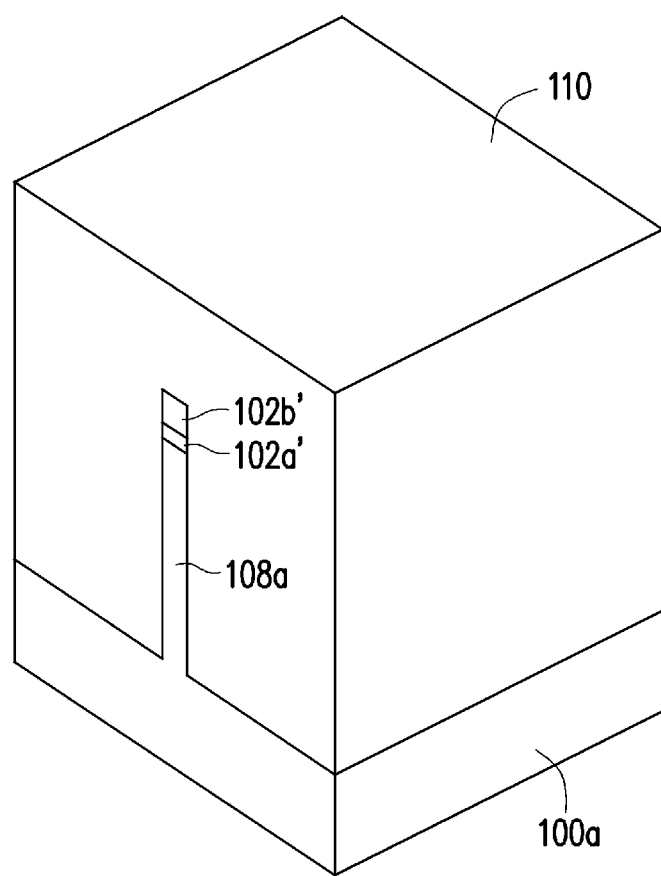

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a FinFET. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

FIGS. 1A-1H are perspective views of a method for fabricating a p-type FinFETs of a semiconductor device in accordance with some embodiments and FIGS. 2A-2H are perspective views of a method for fabricating an n-type FinFETs of a semiconductor device in accordance with some embodiments.

Figure 2A:
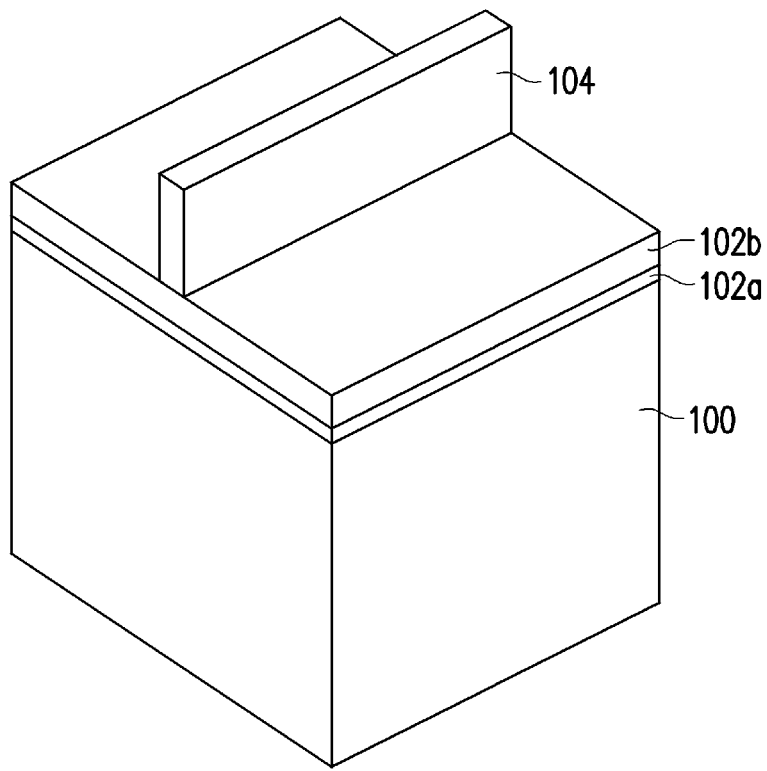
FIGS. 2A-2H are perspective views of a method for fabricating an n-type FinFETs of a semiconductor device in accordance with some embodiments.

Referring to FIG. 1A and FIG. 2A, a substrate 100 is provided. In some embodiments, the substrate 100 includes a crystalline silicon substrate (e.g., wafer). The substrate 100 may comprise n-type doped regions and p-type doped regions depending on design requirements. The portion of the substrate 100 shown in FIG. 1A is doped with p-type dopants while the portion of the substrate 100 shown in FIG. 2A is doped with n-type dopants. For example, the p-type dopants may be boron or $BF_2$ or combinations thereof while the n-type dopants may be phosphorus, arsenic or combinations thereof. In some embodiments, the substrate 100 including n-type doped regions and p-type doped regions may be an n-type substrate having p-type doped regions (e.g., p-wells) formed therein or a p-type substrate having n-type doped regions (e.g., n-wells) formed therein. In some alternative embodiments, the substrate 100 including n-type and p-type doped regions may be made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, a pad layer 102a and a mask layer 102b are sequentially formed on the p-type region (shown in FIG. 1A) and n-type doped region (shown in FIG. 2A) of the substrate 100. The pad layer 102a may be a silicon oxide thin film formed, for example, by thermal oxidation process. The pad layer 102a may act as an adhesion layer between the substrate 100 and mask layer 102b. The pad layer 102a may also act as an etch stop layer for etching the mask layer 102b. For example, the mask layer 102b is a silicon nitride layer formed by low-pressure chemical vapor deposition (LP-CVD) or plasma enhanced chemical vapor deposition (PECVD). The mask layer 102b is used as a hard mask during subsequent photolithography processes. Then, a patterned photoresist layer 104 having a predetermined pattern is formed on the mask layer 102b.

Figure 2B:
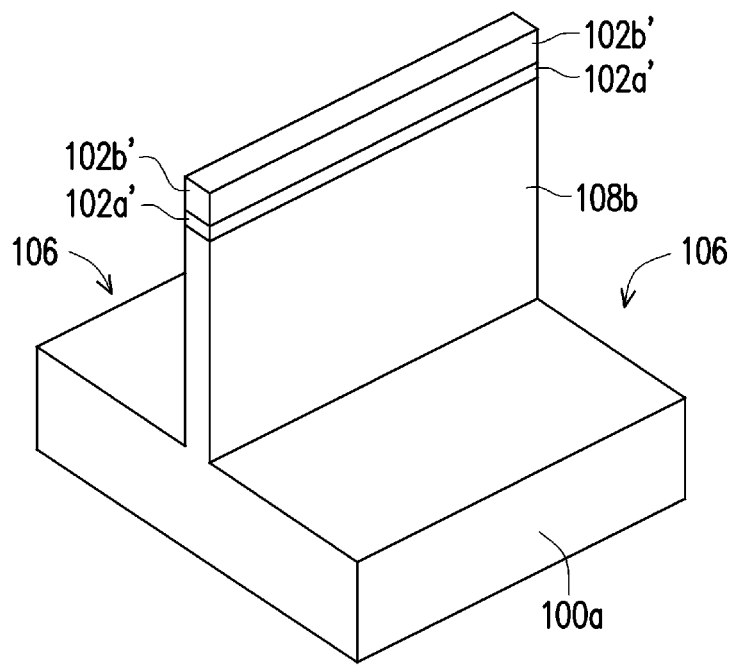

Referring to FIGS. 1A-1B and FIGS. 2A-2B, the mask layer 102b and the pad layer 102a which are not covered by the patterned photoresist layer 104 are sequentially etched to form a patterned mask layer 102b' and a patterned pad layer 102a' so as to expose underlying substrate 100. By using the patterned mask layer 102b', the patterned pad layer 102a' and the patterned photoresist layer 104 as a mask, the substrate 100 is patterned to form a patterned substrate 100a. Portions of the substrate 100 exposed by the patterned mask layer 102b', the patterned pad layer 102a' and the patterned photoresist layer 104 are etched to form trenches 106, at least one first semiconductor fin 108a formed in the p-type region (shown in FIG. 1B) and at least one second semiconductor fin 108b formed in the n-type region (shown in FIG. 2B). The first semiconductor fin 108a is a p-type semiconductor fin and the second semiconductor fin 108b is an n-type semiconductor fin. The number of the first semiconductor fin 108a shown in FIG. 1B and the second semiconductor fin 108b shown in FIG. 2B is merely for illustration, in some alternative embodiments, two or more first semiconductor fins 108a and second semiconductor fins 108b may be formed in accordance with actual design requirements. After the substrate 100 is patterned, the first semiconductor fin 108a and the second semiconductor fin 108b are covered by the patterned mask layer 102b', the patterned pad layer 102a' and the patterned photoresist layer 104. Two adjacent trenches 106 formed in the p-type region (shown in FIG. 1B) of the substrate 100 are spaced from each other by the first semiconductor fin 108a and two adjacent trenches 106 formed in the n-type region (shown in FIG. 2B) of the substrate 100 are spaced from each other by the second semiconductor fin 108b.

The height of the first and second semiconductor fins 108a, 108b and the depth of the trench 106 range from about 5 nm to about 500 nm. After the first semiconductor fin 108a, the second semiconductor fin 180b and the trenches 106 are formed, the patterned photoresist layer 104 is then removed. In one embodiment, a cleaning process may be performed to remove a native oxide of the patterned substrate 100a. The cleaning process may be performed using diluted hydrofluoric (DHF) acid or other suitable cleaning solutions.

Figure 2C:
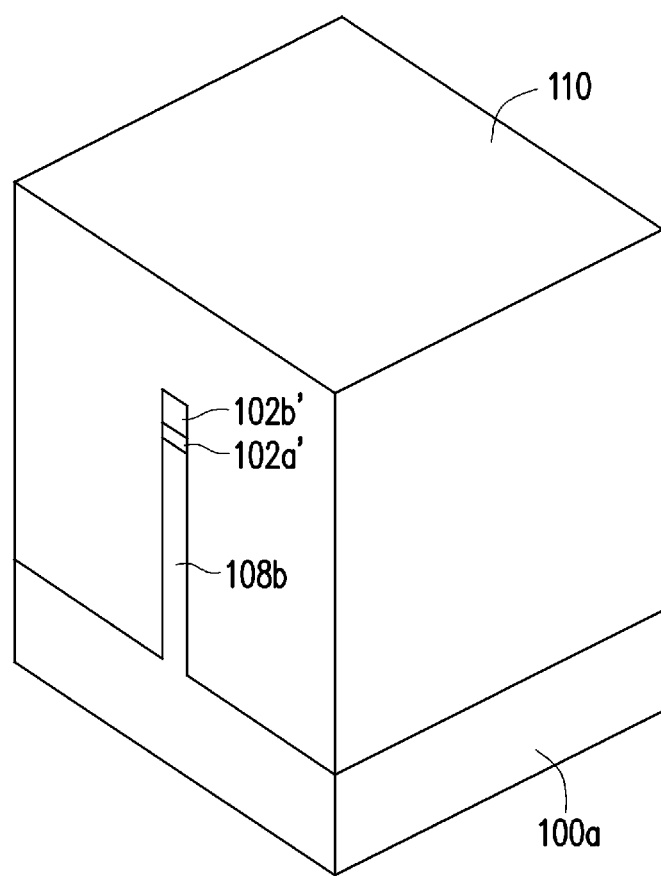

Referring to FIGS. 1B-1C and FIGS. 2B-2C, an insulating material 110 are formed over the patterned substrate 100a to cover the first semiconductor fin 108a formed in the p-type region (shown in FIG. 1C) and the second semiconductor fin 108b formed in the n-type region (shown in FIG. 2C). Furthermore, the insulating material 110 fills the trenches 106. In addition to the first semiconductor fin 108a and the second semiconductor fin 108b, the insulating material 110 further covers the patterned pad layer 102a' and the patterned mask layer 102b'. The insulating material 110 includes silicon oxide, silicon nitride, silicon oxynitride, a spin-on dielectric material, or a low-K dielectric material, for example. The insulating material 110 may be formed by high-density-plasma chemical vapor deposition (HDP-CVD), sub-atmospheric CVD (SACVD) or spin-on.

Figure 1D:
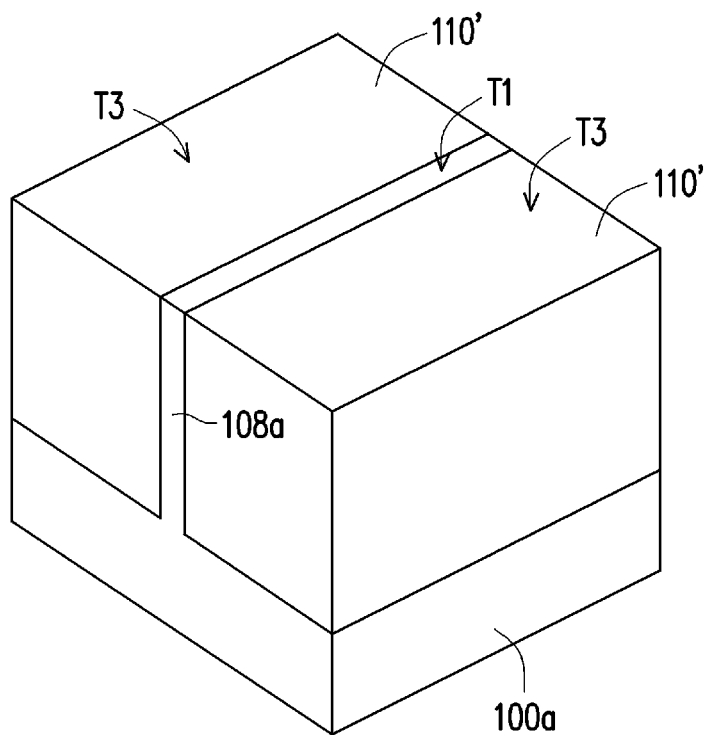
Figure 1E:
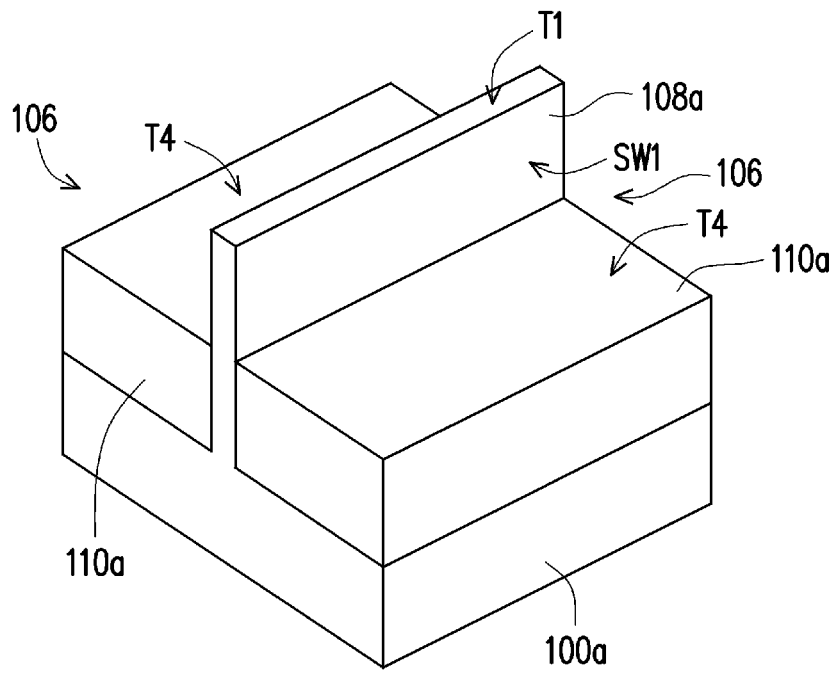
Figure 2D:
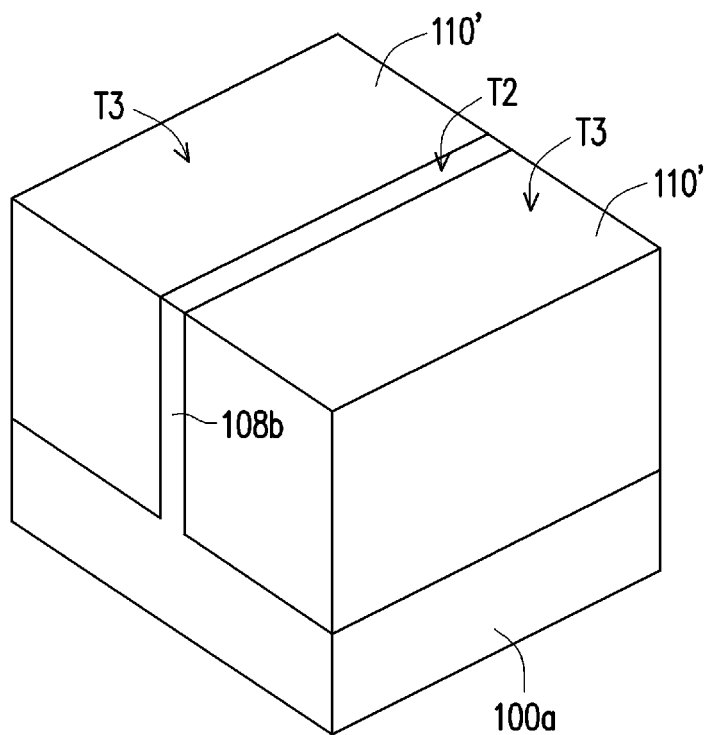
Figure 2E:
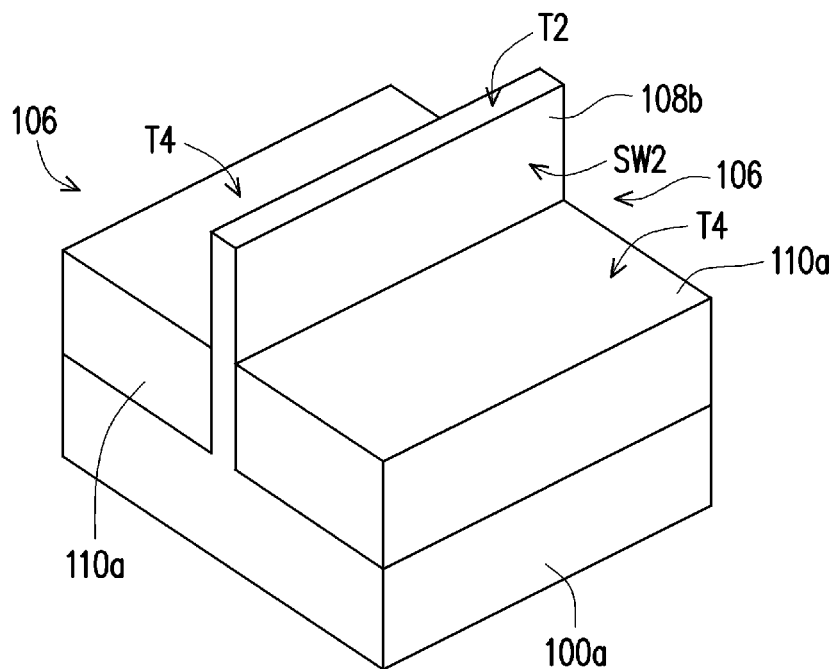

Referring to FIGS. 1C-1D and FIGS. 2C-2D, a chemical mechanical polish process is, for example, performed to remove a portion of the insulating material 110, the patterned mask layer 102b' and the patterned pad layer 102a' until top surfaces T1 and T2 of the first semiconductor fin 108a and the second semiconductor fin 108b are exposed. As shown in FIG. 1D and FIG. 2D, after the insulating material 110 is polished, a polished insulating material 110' is formed and top surfaces T3 of the polished insulating material 110' are substantially coplanar with the top surface T1 of the first semiconductor fin 108a and the top surface T2 of the second semiconductor fin 108b.

Referring to FIGS. 1D-1E and FIGS. 2D-2E, the polished insulating material 110' is partially removed by an etching process such that insulators 110a are formed on the patterned substrate 100a and each insulator 110a is located in one of the trenches 106 correspondingly. In some embodiments, the etching process may be a wet etching process with hydrofluoric acid (HF) or a dry etching process. Top surfaces T4 of the insulators 110a are lower than the top surface T1 of the first semiconductor fin 108a and the top surface T2 of the second semiconductor fin 108b. In other words, the first and second semiconductor fins 108a, 180b protrude from the top surfaces T4 of the insulators 110a and sidewalls SW1, SW2 of the first and second semiconductor fins 108a, 108b are thus exposed.

Referring to FIGS. 1E-1F and FIGS. 2E-2F, after the insulators 110a are formed, a first gate stack GS1 and a second gate stack GS2 are formed to partially cover the first semiconductor fin 108a and the second semiconductor fin 108b respectively. In other words, portions of the first semiconductor fin 108a and the second semiconductor fin 108b and portions of the insulators 110a are exposed.

In some embodiments, the first gate stack GS1 includes a first gate 120, a first gate dielectric layer 112a and a pair of first spacers 116a while the second gate stack GS2 includes a second gate 122, a second gate dielectric layer 112b and a pair of second spacers 116b. The first gate 120 is disposed over the first gate dielectric layer 112a. The first gate dielectric layer 112a partially covers the first semiconductor fin 108a and is sandwiched between the first semiconductor fin 108a and the first gate 120. The pair of first spacers 116a are disposed over the first gate dielectric layer 112a and extend along sidewalls of the first gate 120. The second gate 122 is disposed over the second gate dielectric layer 112b. The second gate dielectric layer 112b partially covers the second semiconductor fin 108b and is sandwiched between the second semiconductor fin 108b and the second gate 122. The pair of second spacers 116b are disposed over the second gate dielectric layer 112b and extend along sidewalls of the second gate 122.

Figure 1F:
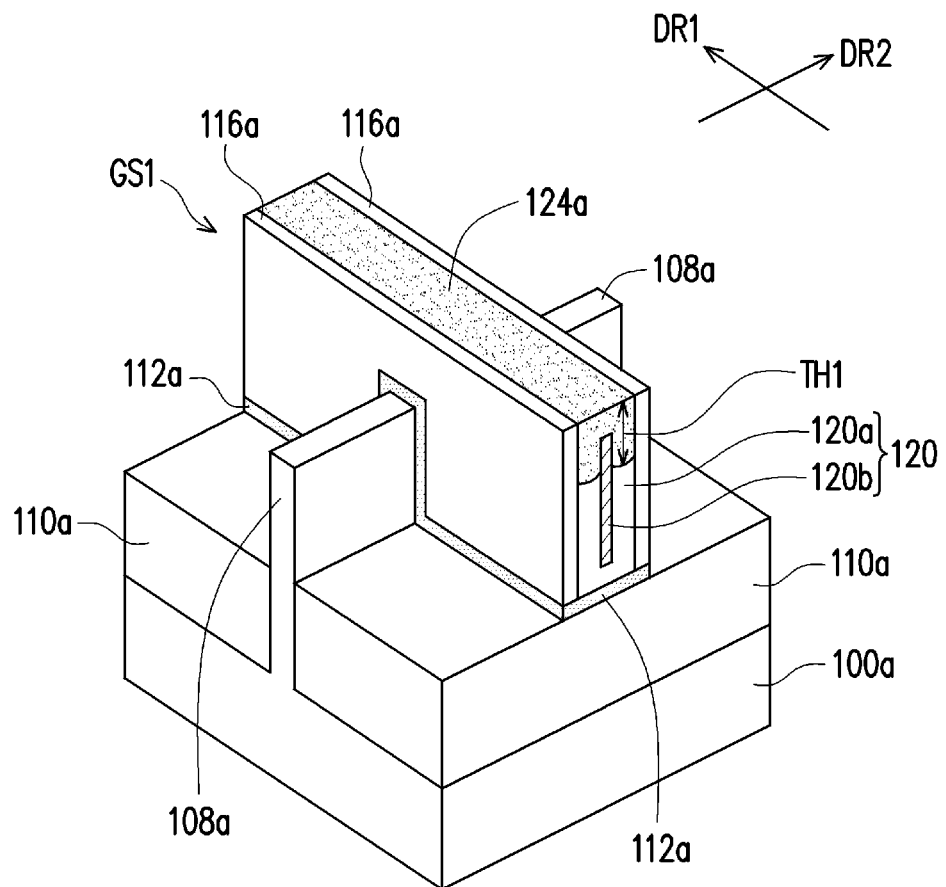
Figure 2F:
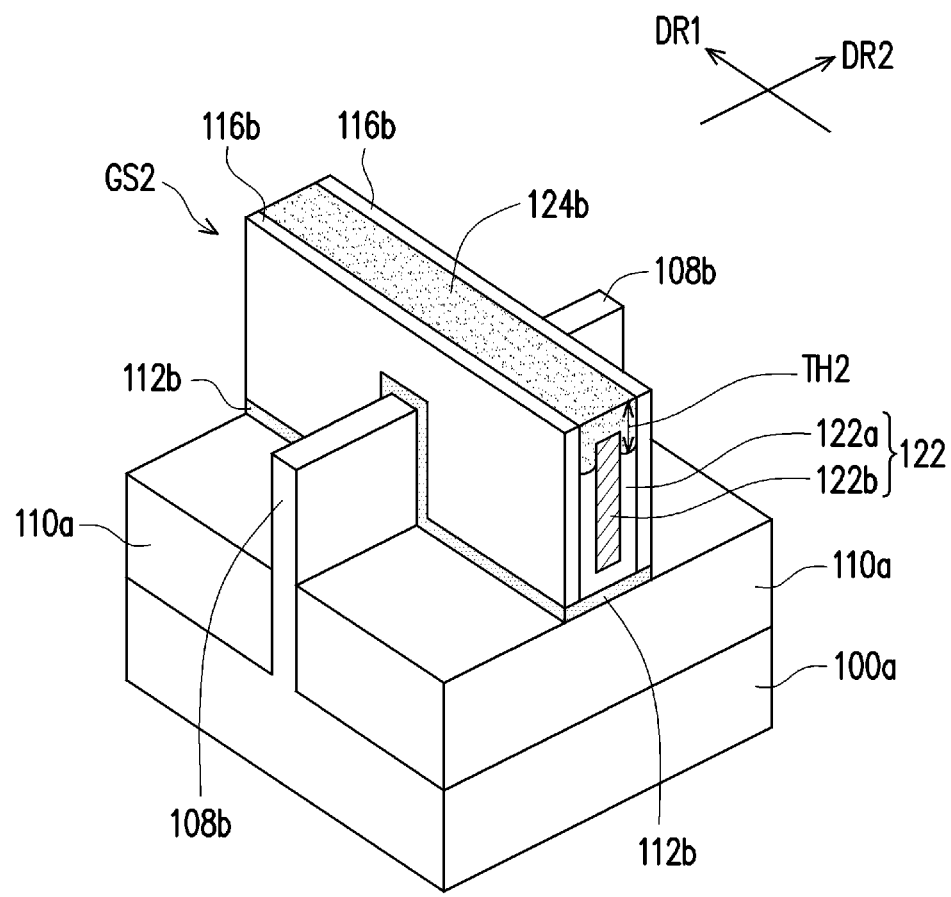

In some alternative embodiments, the first gate stack GS1 may further include a first dielectric cap 124a formed between the pair of first spacers 116a and the second gate stack GS2 may further include a second dielectric cap 124b formed between the pair of second spacers 116b. The first dielectric cap 124a formed between the pair of first spacers 116a covers the first gate 120 and the second dielectric cap 124b formed between the pair of second spacers 116b covers the first gate 122. As shown in FIG. 1F and FIG. 2F, the maximum thickness TH1 of the first dielectric cap 124a is smaller than the maximum thickness TH2 of the second dielectric cap 124b.

In some embodiments, the first gate dielectric layer 112a and the second gate dielectric layer 112b are made from the same dielectric material, for example. The first gate dielectric layer 112a and the second gate dielectric layer 112b may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 112 is a high-k dielectric layer with a thickness in the range of about 0.2 nm to 50 nm. The first gate dielectric layer 112a and the second gate dielectric layer 112b may be formed by a suitable process such as atomic layer deposition (ALD), chemical vapor deposition (CVD), physical vapor deposition (PVD), thermal oxidation or UV-ozone oxidation.

In some embodiments, the pair of first spacers 116a and the pair of second spacers 116b are formed of the same dielectric material, such as silicon nitride or SiCON. The pair of first spacers 116a and the pair of second spacers 116b may include a single layer or multilayer structure, for example.

A lengthwise direction DR1 of the first gate 120 and the second gate 122 is different from a lengthwise direction DR2 of the first and second semiconductor fins 108a, 108b. In some embodiments, the lengthwise direction DR1 of the first and second gates 120, 122 is perpendicular to the lengthwise direction DR2 of the first and second semiconductor fins 108a, 108b. The number of the first and second gates 120, 122 shown in FIG. 1F and FIG. 2F is merely for illustration, in some alternative embodiments, more gate stacks may be formed in accordance with actual design requirements.

In order to match with characteristics of the first semiconductor fin 108a and the second semiconductor fin 108b and to lower threshold voltages of P-type FinFET and n-type FinFET, work function of the first gate 120 is greater than work function of the second gate 122. The first gate 120 includes a first work function metal 120a disposed on the gate dielectric layer 112 and a first main metal 120b embedded in the first work function metal 120a. The second gate 122 includes a second work function metal 122a disposed on the gate dielectric layer 112 and a second main metal 122b embedded in the second work function metal 122a.

In some embodiments, the first gate 120 may be formed by sequentially depositing a first work function metallic layer and a first main metallic layer; polishing the first work function metallic layer and the first main metallic layer partially; and partially removing the first work function metallic layer and the first main metallic layer through an etch process so as to form the first gate 120 and a first gate recess between the pair of first spacers 116a. The first dielectric cap 124a fills the first gate recess and covers the first gate 120. For example, the first work function metallic layer and the first main metallic layer are back-etched by Ar, $O_2$, $N_2$, He, $SO_2$, $Cl_2$, $SiCl_4$, $SF_6$, $BCl_3$, $NF_3$, HBr, $CH_4$, $CF_4$, $CHF_3$, $CH_2F_2$, $CH_3F$, $C_4F_8$, $C_xH_yF_z$, (x>0, y>0, z>0) or combinations thereof. As shown in FIG. 1F, due to etching selectivity, the first work function metallic layer is etched more efficiently than the first metallic layer and the first main metal 120b protrudes from the top surface of the first work function metal 120a.

Similarly, the second gate 122 may be formed by sequentially depositing a second work function metallic layer and a second main metallic layer; polishing the second work function metallic layer and the second main metallic layer partially; and partially removing the second work function metallic layer and the second main metallic layer through another etch process so as to form the second gate 122 and a second gate recess between the pair of second spacers 116b. The second dielectric cap 124b fills the second gate recess and covers the second gate 120. For example, the second work function metallic layer and the second main metallic layer are back-etched by Ar, $O_2$, $N_2$, He, $SO_2$, $Cl_2$, $SiCl_4$, $SF_6$, $BCl_3$, $NF_3$, HBr, $CH_4$, $CF_4$, $CHF_3$, $CH_2F_2$, $CH_3F$, $C_4F_8$, $C_xH_yF_z$, (x>0, y>0, z>0) or combinations thereof. As shown in FIG. 2F, due to etch selectivity, the second work function metallic layer is etched more efficiently than the second metallic layer and the second main metal 122b protrudes from the top surface of the second work function metal 122a.

In some embodiments, the first main metal 120b of the first gate 120 and the second main metal 122b of the second gate 122 may be made of same material and have same work function; and work function of the first work function metal 120a may be greater than work function of the second work function metal 122a. For example, work function of the first work function metal 120a may be greater than work function of the first main metal 120b while work function of the second work function metal 122a may be smaller than work function of the second main metal 122b. In some embodiment, the first work function metal 120a with higher work function (e.g., 5.5 eV) and the second work function metal 122a with lower work function (e.g., 4 eV) may include Tantalum (Ta), Tantalum nitride (TaN), titanium nitride (TiN) or combinations thereof; and the first main metal 120b and the second main metal 122b include tungsten (W) and so on. Work function of the first main metal 120b and the second main metal 122b may be 4.5 eV, for example.

Figure 1G:
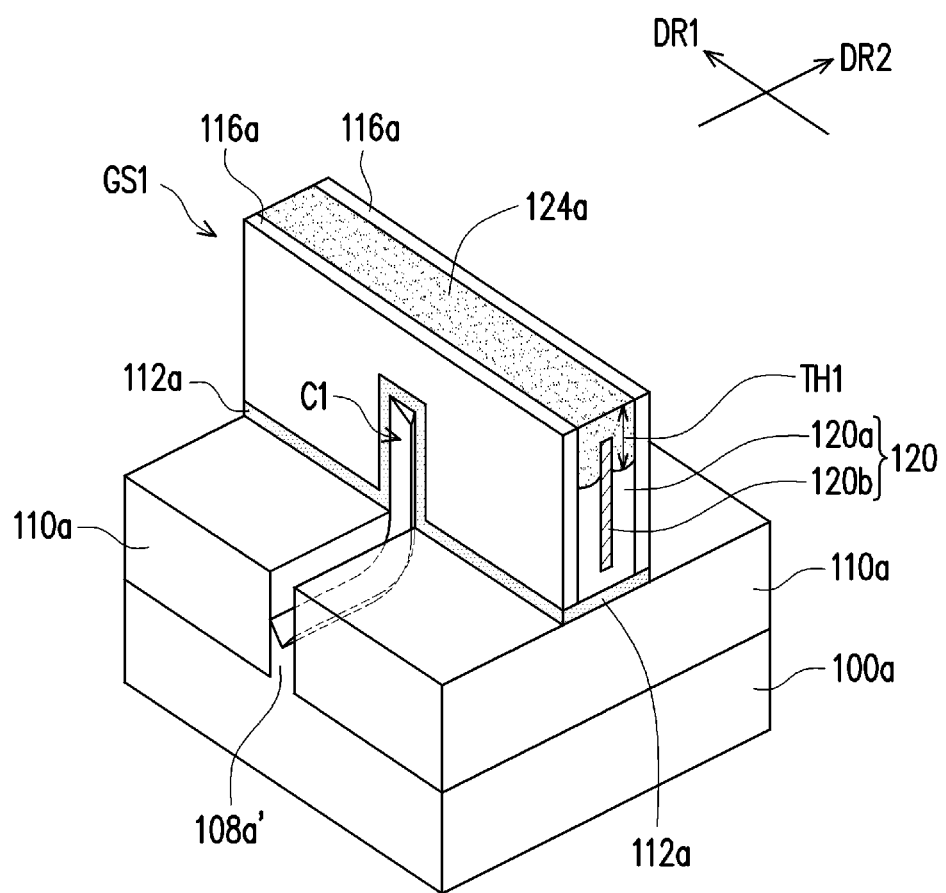

Referring to FIGS. 1F-1G, FIGS. 2F-2G, FIG. 3A and FIG. 3B, after the first gate stack GS1 and the second gate stack GS2 are formed, a first fin recess process is performed on the first semiconductor fin 108a so as to partially remove portions of the first semiconductor fin 108a uncovered by the first gate stack GS1. After the first fin recess process is performed, in some embodiments, the first semiconductor fin 108a is further patterned by etching process and a p-type semiconductor fin 108a' is formed, as shown in FIG. 1G. The etching recipe of the first fin recess process is illustrated as followings. The Etchant includes $N_2$, $O_2$, He, Ar, $CH_4$, $CF_4$, HBr, $CH_3F$, $CHF_3$, $BCl_3$, $Cl_2$, $NF_3$, $SO_2$, $SF_6$, $SiCl_4$, or combinations thereof; power ranges from 100 W to 1500 W; process temperature ranges from 10 degree to 80 degree Celsius; and pressure ranges from 1 mtorr to 75 mtorr. In some embodiments, multi etch steps are performed to control profile of the p-type semiconductor fin 108a'.

Figure 3A:
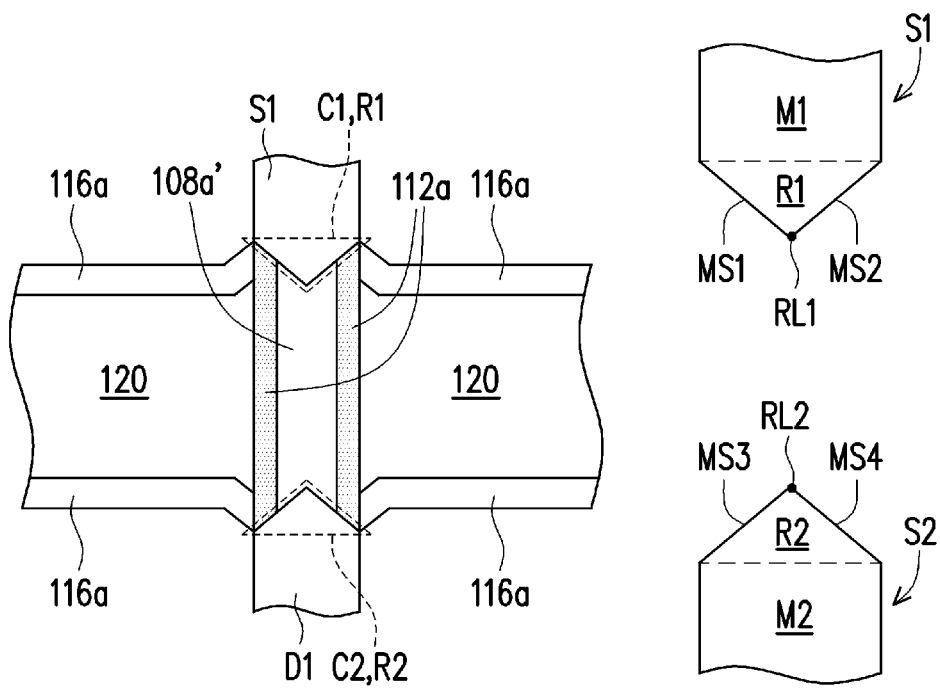
FIG. 3A is a cross-sectional view of the p-type FinFETs along the A-A' cross-section illustrated in FIG. 1H.

As shown in FIG. 1G and FIG. 3A, the semiconductor fin 108a' extends along a widthwise direction (i.e. the lengthwise direction DR2) of the first gate stack GS1 and has a first concave C1 and a second concave C2 exposed at sidewalls of the first gate stack GS1, respectively. In some embodiments, the first concave C1 and the second concave C2 are V-shaped concaves, for example. In other words, the first concave C1 and the second concave C2 are concaves having a V-shaped bottom surface.

Figure 2G:
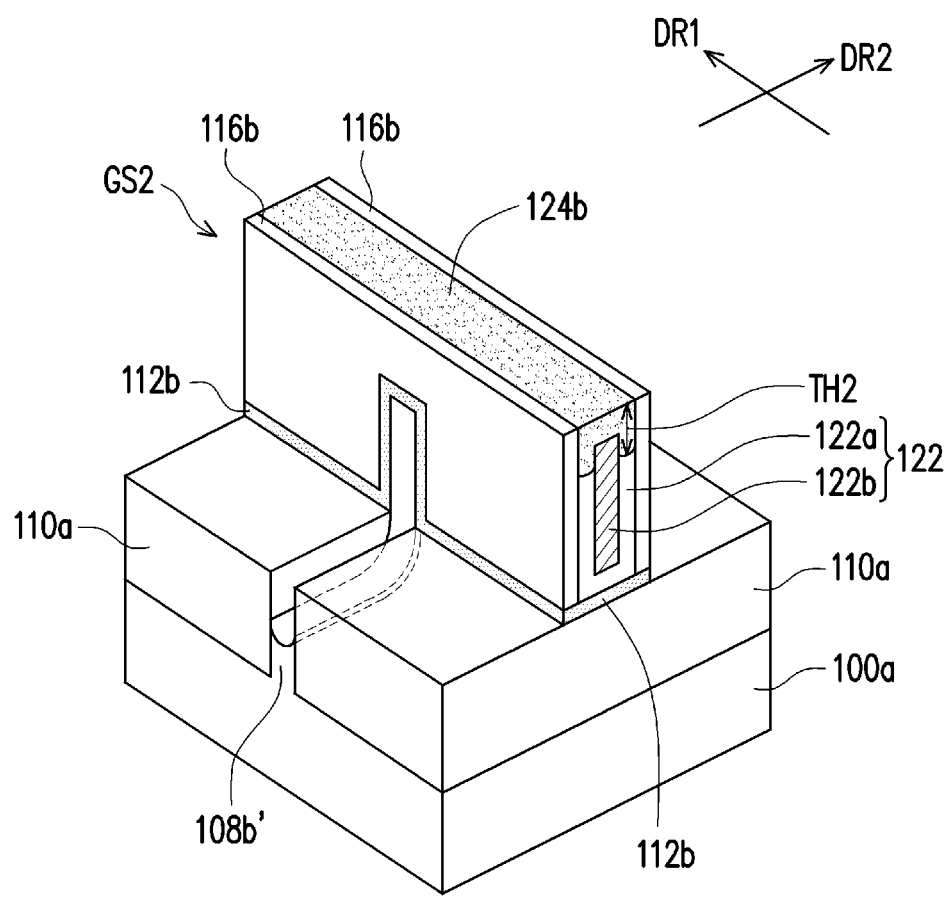

After the first gate stack GS1 and the second gate stack GS2 are formed, a second fin recess process is performed on the second semiconductor fin 108b so as to partially remove portions of the second semiconductor fin 108b uncovered by the second gate stack GS2. After the second fin recess process is performed, in some embodiments, the second semiconductor fin 108b is further patterned by etching process and an n-type semiconductor fin 108b' is formed, as shown in FIG. 2G. The etching recipe of the first fin recess process is illustrated as followings. The Etchant includes $N_2$, $O_2$, He, Ar, $CH_4$, $CF_4$, HBr, $CH_3F$, $CHF_3$, $BCl_3$, $Cl_2$, $NF_3$, $SO_2$, $SF_6$, $SiCl_4$, or combinations thereof; power ranges from 100 W to 1500 W; process temperature ranges from 10 degree to 80 degree Celsius; and pressure ranges from 1 mtorr to 75 mtorr.

Figure 3B:
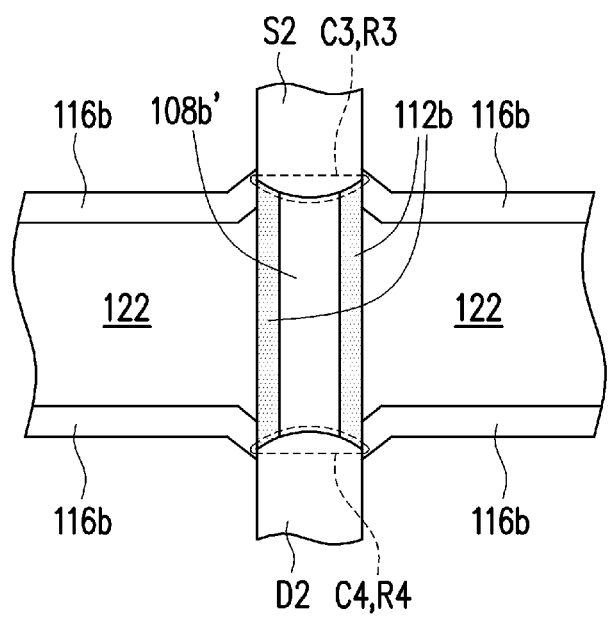
FIG. 3B is a cross-sectional view of the n-type FinFETs along the B-B' cross-section illustrated in FIG. 2H.

As shown in FIG. 2G and FIG. 3B, the semiconductor fin 108b' extends along a widthwise direction (i.e. the lengthwise direction DR2) of the second gate stack GS2 and has a third concave C3 and a fourth concave C4 exposed at sidewalls of the second gate stack GS2, respectively. In some embodiments, the third concave C3 and the fourth concave C4 are concaves having a rounding bottom surface, for example.

It is noted that the sequence of the aforesaid first and second fin recess processes is not limited. In some embodiments, the first fin recess process may be performed before the second fin recess process. The second semiconductor fin 108b is protected by a patterned photoresist during the first fin recess process (i.e. formation of the semiconductor fin 108a') and the formed semiconductor fin 108a' is protected by another patterned photoresist during the second fin recess process (i.e. formation of the semiconductor fin 108b'), for example. In some alternative embodiments, the first fin recess process may be performed after the second fin recess process. The first semiconductor fin 108a is protected by a patterned photoresist during the second fin recess process (i.e. formation of the semiconductor fin 108b') and the formed semiconductor fin 108b' is protected by another patterned photoresist during the first fin recess process (i.e. formation of the semiconductor fin 108a'), for example.

Referring to FIGS. 1G-1H, FIGS. 2G-2H, FIG. 3A and FIG. 3B, after the first and second fin recess processes are performed, a first source S1 and a first drain D1 are formed at two opposite sides of the first gate stack GS1 while a second source S2 and a second drain D2 are formed at two opposite sides of the second gate stack GS2. In some embodiments, the first source S1, the first drain D1, the second source S2 and the second drain D2 are formed by epitaxial process. For example, the first source S1 and the first drain D1 are selectively grown from the semiconductor fin 108a' while the second source S2 and the second drain D2 are selectively grown from the semiconductor fin 108b'.

For example, the material of the first source S1 and the first drain D1 may be silicon germanium (SiGe) that is epitaxial-grown by LPCVD process while the material of the second source S2 and the second drain D2 may be silicon carbon (SiC) that is epitaxial-grown by LPCVD process. The semiconductor fins 108a' covered by the first gate stack GS1 is strained or stressed by the first source S1 and the first drain D1 to enhance carrier mobility and performance of the p-type FinFET. The semiconductor fins 108b' covered by the second gate stack GS2 is strained or stressed by the second source S2 and the second drain D2 to enhance carrier mobility and performance of the n-type FinFET.

Figure 1H:
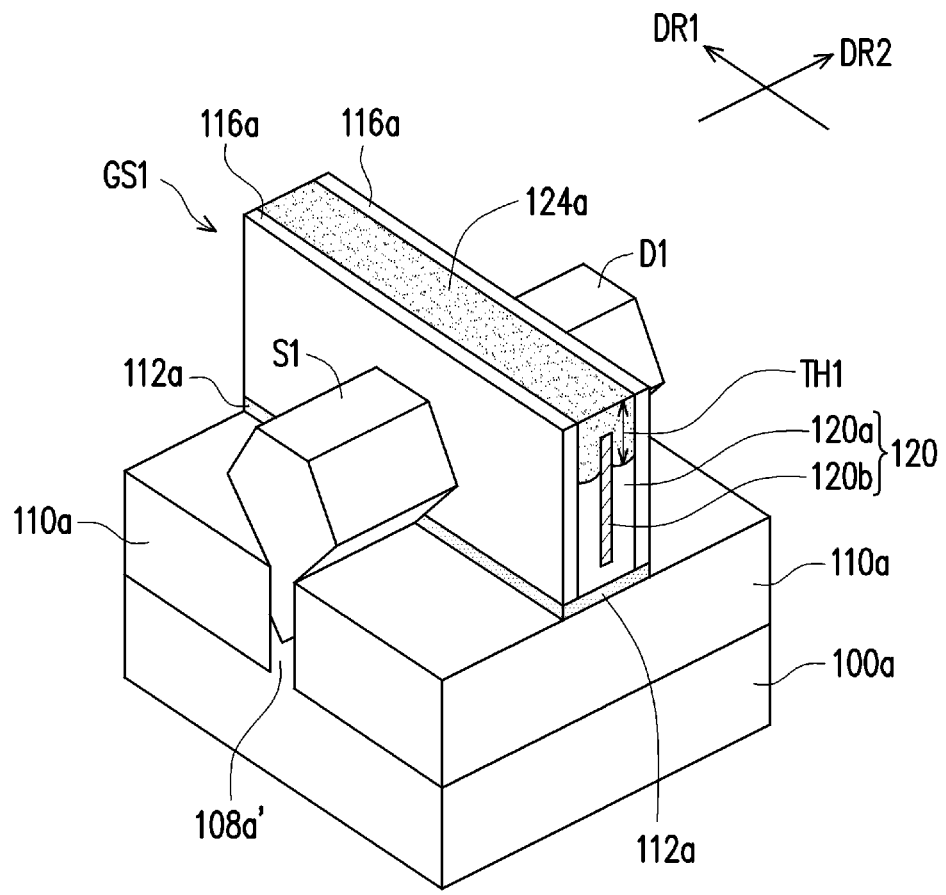

As shown in FIG. FIG. 1H and FIG. 3A, the first source S1 includes a first main portion M1 and a first ridge portion R1 protruding from the first main portion M1, wherein the first ridge portion R1 is embedded in the first concave C1 and the first main portion M1 is distributed outside the first concave C1. The first drain D1 includes a second main portion M2 and a second ridge portion R2 protruding from the second main portion M2, wherein the second ridge portion R2 is embedded in the second concave C2 and the second main portion M2 is distributed outside the second concave C2. The first ridge portion R1 and the second ridge portion R2 extend along a height direction of the semiconductor fin 108a'. In some embodiments, the first concave C1 of the semiconductor fin 108a' and the gate dielectric layer 112a provide a V-groove for accommodating and in contact with the first ridge portion RE and the second concave C2 of the semiconductor fin 108a' and the gate dielectric layer 112a provide another V-groove for accommodating and in contact with the second ridge portion R2.

The first ridge portion R1 of the first source S1 includes two first main surfaces MS1, MS2 interconnected at a first ridge line RL1 of the first ridge portion R1. The second ridge portion R2 of the first drain D1 includes two second main surfaces MS3, MS4 interconnected at a second ridge line RL2 of the second ridge portion R2. The first main surfaces MS1, MS2 are connected to or in contact with the first concave C1 of the semiconductor fin 108a' and the second main surfaces MS3, MS4 are connected to the second concave C2 of the semiconductor fin 108a'. Furthermore, included angles between the first main surfaces MS1, MS2 and between the second main surfaces MS3, MS4 are smaller than 90 degrees, for example.

In some embodiments, the first and second ridge lines RL1, RL2 extend along height direction of the semiconductor fin 108a' and point the semiconductor fin 108a'. Furthermore, the first and second ridge lines RL1, RL2 are in contact with the semiconductor fin 108a'.

Figure 2H:
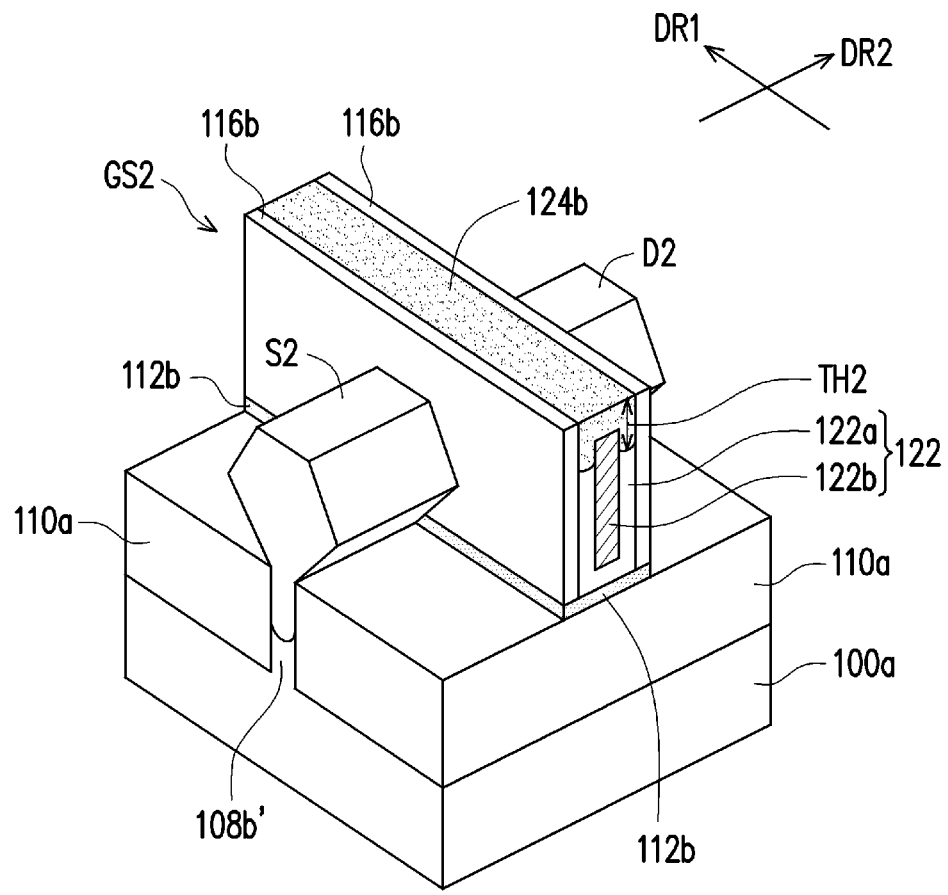

As shown in FIG. 2H and FIG. 3B, the second source S2 includes a first rounding protrusion R3 embedded in the third concave C3 and the second drain D2 includes a second rounding protrusion R4 embedded in the fourth concave C4. The first rounding protrusion R3 and second rounding protrusion R4 extend along a height direction of the second semiconductor fin 108b'. In some embodiments, the third concave C3 of the semiconductor fin 108b' and the gate dielectric layer 112b provide a rounding groove for accommodating the first rounding protrusion R3 and the fourth concave C4 of the semiconductor fin 108b' and the gate dielectric layer 112b provide a another rounding groove for accommodating the rounding protrusion R4.

Referring to FIG. 3A and FIG. 3B, since the first and second concaves C1, C2 are formed by a same etching process, the first and second concaves C1, C2 are identical in depth. Similarly, since the third and fourth concaves C3, C4 are formed by a same etching process, the third and fourth concaves C3, C4 are identical in depth. It is noted that depths of the first and second concaves C1, C2 are greater than depths of the third and fourth concaves C3, C4. In other words, profiles of the first ridge portion R1 and the second ridge portion R2 are sharper than profiles of the first rounding protrusion R3 and second rounding protrusion R4. Accordingly, device boost of the FinFET including the semiconductor fin 108b' is enhanced.

In the above-mentioned semiconductor device including at least one n-type FinFET and at least one p-type FinFET, yield rate and reliability are enhanced.

In accordance with some embodiments of the present disclosure, a FinFET including a gate stack, a semiconductor fin embedded in the gate stack, a source and a drain disposed is provided. The semiconductor fin extends along a widthwise direction of the gate stack and has a first concave and a second concave exposed at sidewalls of the gate stack respectively. The source and drain are disposed at two opposite sides of the gate stack. The source includes a first portion in contact with and embedded in the first concave. The drain includes a second portion in contact with and embedded in the second concave. The first portion and the second portion are covered by the gate stack.

In accordance with alternative embodiments of the present disclosure, a FinFET including a gate stack, a semiconductor fin embedded in the gate stack, a source and a drain disposed is provided. The semiconductor fin extends along a widthwise direction of the gate stack. The semiconductor fin includes a first concave and a second concave exposed at sidewalls of the gate stack respectively. The source and drain are disposed at two opposite sides of the gate stack. The source laterally extends into and fills the first concave. The drain laterally extends into and fills the second concave, and the source and the drain are partially covered by the gate stack.

In accordance with yet alternative embodiments of the present disclosure, a semiconductor device including first FinFET and a second FinFET is provided. The first FinFET includes a first gate stack, a first semiconductor fin embedded in the first gate stack, a first source and a first drain. The first semiconductor fin extends along a widthwise direction of the first gate stack and has a first concave and a second concave exposed at sidewalls of the gate stack respectively. The first source and the first drain are disposed at two opposite sides of the first gate stack. The first source fills the first concave, the first drain fills the second concave, and the first source and the first drain are partially covered by the first gate stack. The second FinFET includes a second gate stack, a second semiconductor fin embedded in the second gate stack, a second source and a second drain. The second semiconductor fin extends along a widthwise direction of the second gate stack and has a third concave and a fourth concave exposed at sidewalls of the second gate stack respectively. The second source and the second drain are disposed at two opposite sides of the second gate stack. The second source fills the third concave, the second drain fills the fourth concave, and the second source and the second drain are partially covered by the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin;
   forming a gate stack wrapping a portion of the semiconductor fin, the semiconductor fin extending along a widthwise direction of the gate stack;
   partially removing the semiconductor fin until a first concave and a second concave of the semiconductor fin are respectively formed at opposite sidewalls of the gate stack; and
   forming a source and a drain at opposite sides of the gate stack, the source laterally protruding into the first concave, and the drain laterally protruding into the second concave.

2. The method of claim 1, wherein the first concave and the second concave are V-shaped concaves formed through an etching process.

3. The method of claim 1, wherein the first concave and the second concave are rounding concaves formed through an etching process.

4. The method of claim 1, wherein the first concave and the second concave are formed through an etching process by using the gate stack as an etching mask, and the portion of the semiconductor fin wrapped by the gate stack is laterally over-etched to form the first concave and the second concave.

5. The method of claim 1, wherein the source and the drain are formed through an epitaxial process.

6. The method of claim 5, wherein the source and the drain are epitaxially grown from surfaces of the semiconductor fin, the source fills the first concave and extends laterally to outside of the first concave, and the drain fills the second concave and extends laterally to outside of the second concave.

7. The method of claim 5, wherein the source and the drain are epitaxially grown from surfaces of the semiconductor fin, the source fills the first concave and extends along the widthwise direction of the gate stack, and the drain fills the second concave and extends along the widthwise direction of the gate stack.

8. A method, comprising:
   forming a semiconductor fin;
   forming a gate stack, the semiconductor fin extending along a widthwise direction of the gate stack;
   partially removing the semiconductor fin until a first concave and a second concave of the semiconductor fin are respectively formed at opposite sidewalls of the gate stack; and
   forming a source and a drain at opposite sides of the gate stack, wherein the source laterally extends into and fills the first concave, and the drain laterally extends into and fills the second concave, and the source and the drain are partially covered by the gate stack.

9. The method of claim 8, wherein the first concave and the second concave are V-shaped concaves formed through an etching process.

10. The method of claim 8, wherein the first concave and the second concave are rounding concaves formed through an etching process.

11. The method of claim 8, wherein the first concave and the second concave are formed through an etching process by using the gate stack as an etching mask, and a portion of the semiconductor fin embedded in the gate stack is laterally over-etched to form the first concave and the second concave.

12. The method of claim 8, wherein the source and the drain are formed through an epitaxial process.

13. The method of claim 12, wherein the source and the drain are epitaxially grown from surfaces of the semiconductor fin, the source fills the first concave and extends laterally to outside of the first concave, and the drain fills the second concave and extends laterally to outside of the second concave.

14. The method of claim 12, wherein the source and the drain are epitaxially grown from surfaces of the semiconductor fin, the source fills the first concave and extends along the widthwise direction of the gate stack, and the drain fills the second concave and extends along the widthwise direction of the gate stack.

15. The method of claim 8, wherein the gate stack is formed to cover a portion of the semiconductor fin such that a width of the gate stack is greater than a minimum dimension of the semiconductor fin in the widthwise direction of the gate stack.

16. A method, comprising:
   forming a first semiconductor fin and a second semiconductor fin;
   forming a first gate stack and a second gate stack, the first semiconductor fin extending along a first widthwise direction of the first gate stack, and the second semiconductor fin extending along a second widthwise direction of the second gate stack;

partially removing the first semiconductor fin until a first concave and a second concave of the first semiconductor fin are respectively formed at opposite sidewalls of the first gate stack;

partially removing the second semiconductor fin until a third concave and a fourth concave of the second semiconductor fin are respectively formed at opposite sidewalls of the second gate stack;

forming a first source and a first drain at opposite sides of the first gate stack, the first source laterally protruding into the first concave, and the first drain laterally protruding into the second concave, and the first source and the first drain are partially covered by the first gate stack; and forming a second source and a second drain at opposite sides of the second gate stack, the second source laterally protruding into the third concave, and the second drain laterally protruding into the fourth concave, and the second source and the second drain are partially covered by the second gate stack.

17. The method of claim 16, wherein the first concave and the second concave are formed through a first etching process, and the third concave and the fourth concave are formed through a second etching process.

18. The method of claim 17, wherein a first lateral depth of the first and second concaves formed through the first etching process are greater than a second lateral depth of the third and fourth concaves formed through the second etching process.

19. The method of claim 17, wherein profile of the first concave and the second concave are sharper than that of the third concave and the fourth concave.

20. The method of claim 16, wherein the first source, the first drain, the second source and the second drain are formed through an epitaxial process.

* * * * *